(12) United States Patent
Mitzan

(10) Patent No.: US 6,302,963 B1
(45) Date of Patent: *Oct. 16, 2001

(54) BELL JAR HAVING INTEGRAL GAS DISTRIBUTION CHANNELING

(75) Inventor: John M. Mitzan, Wilmington, MA (US)

(73) Assignee: Axcelis Technologies, Inc., Beverly, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/468,238

(22) Filed: Dec. 21, 1999

(51) Int. Cl.$^7$ .................................................. C23C 16/00
(52) U.S. Cl. ............................ 118/715; 118/724; 432/241
(58) Field of Search ................................... 118/715, 724; 432/241

(56) References Cited

U.S. PATENT DOCUMENTS

| | | | |
|---|---|---|---|
| 5,029,554 | 7/1991 | Miyashita et al. | 118/715 |
| 5,062,386 | 11/1991 | Christensen | 118/725 |
| 5,131,842 | * 7/1992 | Miyazaki et al. | 118/715 |
| 5,160,545 | 11/1992 | Maloney et al. | 118/725 |
| 5,318,633 | * 6/1994 | Yamamoto et al. | 118/725 |
| 5,653,806 | 8/1997 | Van Buskirk | 118/715 |
| 5,653,808 | * 8/1997 | MacLeish et al. | 118/715 |
| 5,928,427 | * 7/1999 | Hwang | 118/723 E |
| 5,976,261 | 11/1999 | Moslehi et al. | 118/719 |

OTHER PUBLICATIONS

U.S. application No. 09/476,525, Ko et al., filed Jan. 3, 2000.

* cited by examiner

Primary Examiner—Gregory Mills
Assistant Examiner—Sylvia R. MacArthur
(74) Attorney, Agent, or Firm—John A. Kastelic

(57) ABSTRACT

A thermal process chamber (10) is provided for processing substrates contained therein, comprising (i) a main processing portion (12) in which a substrate to be processed may be positioned, the processing portion defining a first area (44) and providing an opening (21) through which a substrate to be processed may be inserted into and removed from the first area (44) of the process chamber; (ii) an upper portion (11), positioned above the main processing portion, defining a second area (39) and providing a closed end for the process chamber; (iii) a gas injector (18) for providing gas to the second area (39); and (iv) a gas distribution plate (20) separating the first area (44) from the second area (39). The gas distribution plate provides a plurality of passageways (40, 42) for permitting gas provided to the second area to pass into the first area. The gas distribution plate (20) is formed integrally with the main processing portion (12) and with the upper portion (11). In one embodiment, the entire thermal process chamber (10), including the main processing portion (12), the upper portion (11), the gas injector (18), and the gas distribution plate (20) are comprised of silicon carbide (SiC).

10 Claims, 3 Drawing Sheets

BELL JAR HAVING INTEGRAL GAS DISTRIBUTION CHANNELING

FIELD OF THE INVENTION

The present invention relates generally to the field of thermal processing systems, and more particularly to an improved thermal process chamber for a vertical thermal processing system having integral gas distribution channels.

BACKGROUND OF THE INVENTION

Thermal processing furnaces have been widely known and used for many years to perform a variety of semiconductor fabrication processes, including annealing, diffusion, oxidation, and chemical vapor deposition (CVD) processes. As a result, these processes are well understood, especially with regard to the impact of process variables on the quality and uniformity of resulting products. Thermal processing systems typically employ either a horizontal-type or vertical-type furnace. For some applications, vertical-type furnaces are preferred because they create less particles during use, thus decreasing the incidence of contamination and wafer waste, they can be easily automated, and they require less floor space because the vertical orientation of the process chamber results in a relatively small footprint.

Both horizontal-type and vertical-type furnaces are designed to heat semiconductor wafers to desired temperatures to promote either diffusion of implanted dopants to a desired depth while maintaining line widths smaller than one micron, as known, or to perform other conventional processing techniques, such as the application of an oxide layer to the wafer or deposition of a chemical vapor layer to the wafer in a CVD process. Uniform heating of the wafer being processed, as well as uniform gas flow across the surface of the wafer, are critical in these processes.

Conventional vertical-type thermal processing furnaces, utilizing process chambers such as tube or bell jar furnaces, are designed to support the process tube within the furnace in a vertical position. Such vertical-type furnaces also typically employ either an elevator driven pedestal upon which a single wafer resides, or a wafer boat assembly for holding a plurality of wafers, along with appropriate translation mechanisms for moving the wafer(s) in and out of the process tube. Gas injection means are provided for furnaces in which oxide-forming or CVD processes are to be performed. As the critical dimensions for silicon integrated circuits are continuously scaled downward into the submicron regime, requirements for both wafer temperature uniformity and gas flow uniformity, as well as wafer-to-wafer process repeatability, become more stringent.

Prior art techniques and mechanisms for providing uniform gas flows in the processing chamber include, for a batch (wafer boat) environment, perforated gas tubes running the vertical length of the tube. Such a system is shown in U.S. Pat. No. 5,029,554 to Miyashita et al. In a single wafer environment, known mechanisms for controlling gas distribution flows across the wafer surface include that shown in U.S. Pat. No. 5,062,386 to Christensen, wherein a central passageway directs a portion of the gas flow toward the top of the bell jar, and imparts a radial component to another portion of the gas flow, to obtain a desired distribution of gas flow in the process chamber.

Alternatively, a quartz injector tube vertically positioned along an inside wall of the processing chamber may be provided. The injector tube may be either perforated along its length, or provide an outlet near the top thereof for gas injection into the processing chamber. The gas flow patterns provided by such injector tubes, however, are not axisymmetric with respect to the longitudinal axis of the processing chamber, providing instead asymmetric gas flows with inherent eddy currents.

Still further, a showerhead-type gas distribution device, such as a baffle plate, may be employed to evenly disperse gas over the surface of a wafer, as shown in U.S. Pat. Nos. 5,653,806 or 5,976,261. In the case of such a showerhead-type gas baffle plate, deformation or "sag" of the structure of the baffle plate, caused by high temperature processing, may result in uneven gas distribution across the surface of the wafer. Such deformation is particularly problematic is the baffle plate is constructed from quartz. Accordingly, prior art designs such as that shown in U.S. Pat. Nos. 5,653,806 or 5,976,216 incorporate a temperature controlling mechanism adjacent to or integral with the shower head baffle plate. Such added components add both cost and complexity to the furnace design.

Accordingly, it is an object of the present invention to provide a simplified gas distribution mechanism that can withstand high temperature processes in a wafer processing system. It is a further object to provide such a mechanism in a vertical-type thermal processing furnace.

SUMMARY OF THE INVENTION

A thermal process chamber is provided for processing substrates contained therein, comprising (i) a main processing portion in which a substrate to be processed may be positioned, the processing portion defining a first area and providing an opening through which a substrate to be processed may be inserted into and removed from the first area of the process chamber; (ii) an upper portion, positioned above the main processing portion, defining a second area and providing a closed end for the process chamber; (iii) a gas injector for providing gas to the second area; and (iv) a gas distribution plate separating the first area from the second area. The gas distribution plate provides a plurality of passageways for permitting gas provided to the second area to pass into the first area. The gas distribution plate is formed integrally with the main processing portion and with the upper portion. In one embodiment, the entire thermal process chamber, including the main processing portion, the upper portion, the gas injector, and the gas distribution plate are comprised of silicon carbide (SiC).

DETAILED DESCRIPTION OF A PREFERRED EMBODIMENT

Figure 1:
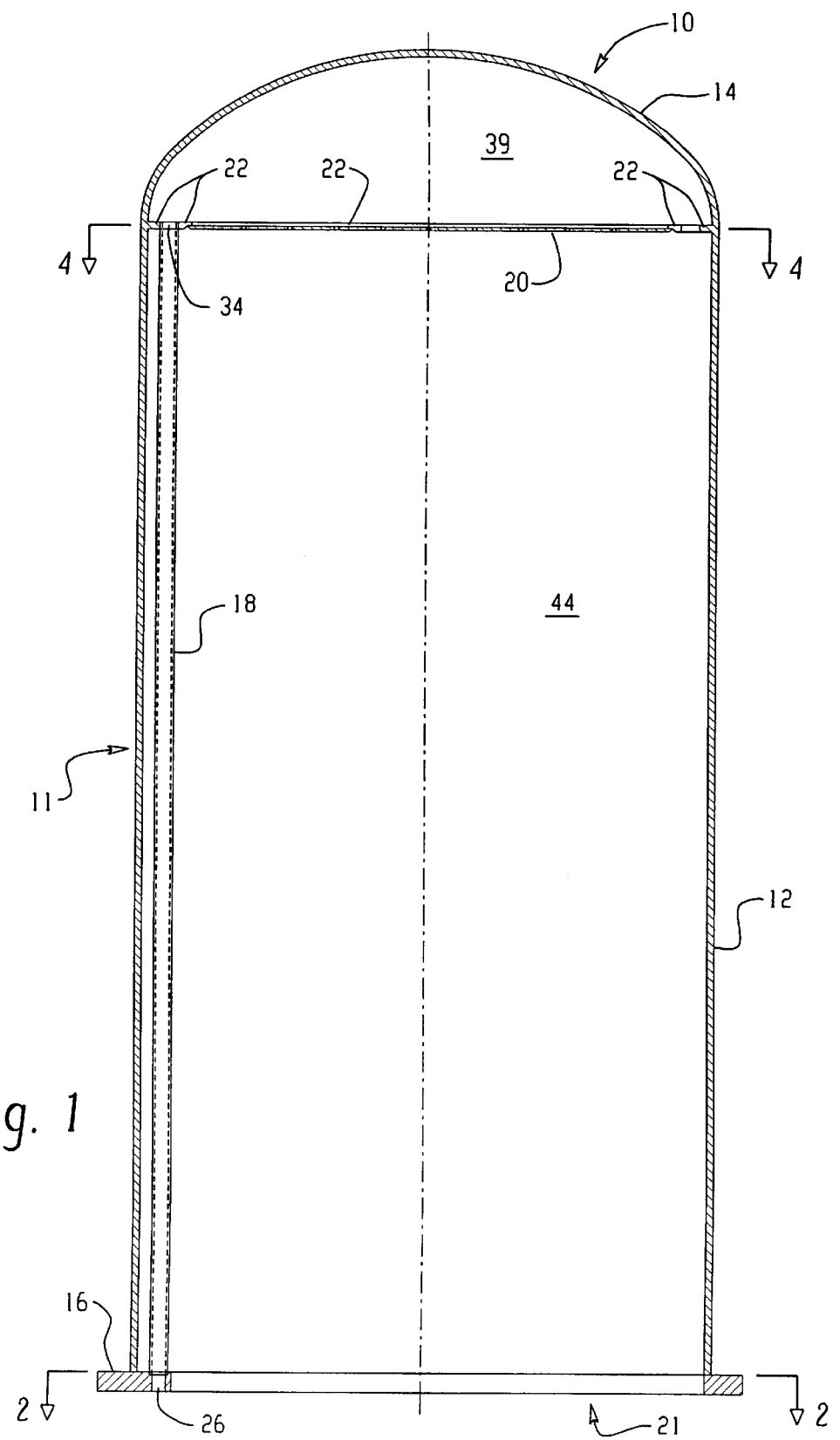
FIG. 1 is a sectional view of a thermal process chamber constructed according to the principles of the present invention.

Referring now to the drawings, FIG. 1 discloses a thermal process chamber 10 constructed according to the principles of the present invention. The thermal process chamber 10 is comprised of (i) a bell jar 11, which itself is comprised of a cylindrical main portion 12 and a closed end portion or domed crown 14; (ii) a base or lower flange 16; (iii) an injector tube 18 residing within the cylindrical main portion 12 of the bell jar 11; and (iv) a disc-shaped gas distribution plate 20, positioned within the bell jar 11 proximate at the junction of the cylindrical main portion 12 and the domed crown 14. The injector tube 18 and the distribution plate 20 function, as further described below, to evenly distribute process gas to the cylindrical main portion 12 of the bell jar 11.

In the preferred embodiment, silicon carbide (SiC) is used to construct the cylindrical main portion 12 and the domed crown 14 of the bell jar 11, the lower flange 16, the injector tube 18, and the gas distribution plate 20. The entire process chamber 10 is assembled from these components in a "green" state, and then cured or hot-fired in an oven to complete an entire integral assembly.

The cylindrical main portion 12 and the domed crown 14 of the bell jar 11 are formed of silicon carbide approximately 6 millimeters (mm) thick. Formed near the junction of the cylindrical main portion 12 and the domed crown 14 is an inwardly protruding ridge 22 that extends about the periphery of the bell jar 11. The ridge may be formed separately or may be formed integrally with either the cylindrical main portion 12 or the domed crown 14. The cylindrical main portion 12, the domed crown 14 and the inwardly extending ridge are joined together in their green state to form an uncured green bell jar 11.

Figure 2:
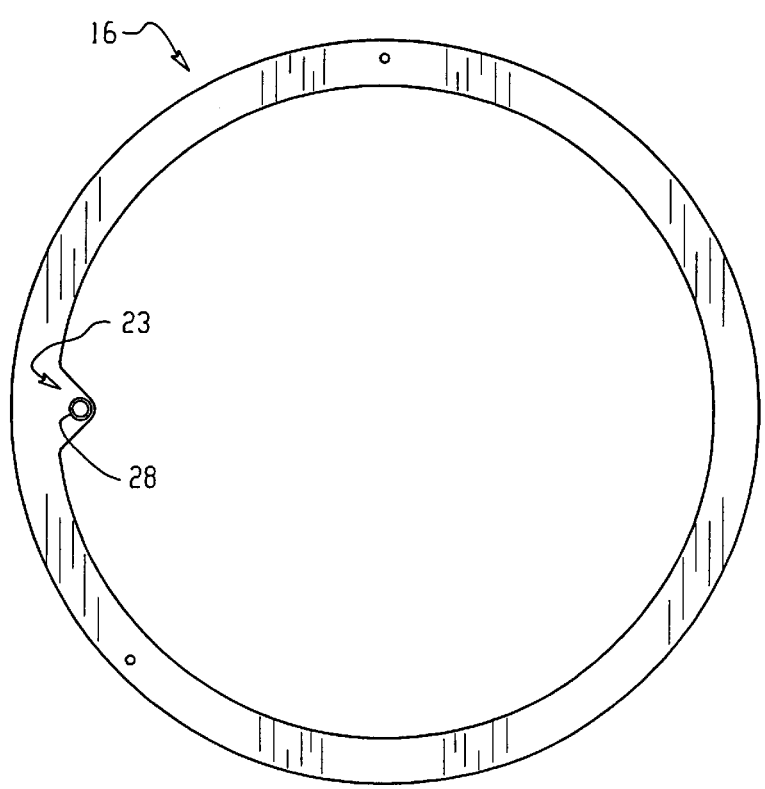
FIG. 2 is a sectional view of the thermal process chamber of FIG. 1, taken along the lines 2—2, showing the lower flange of the processing chamber.
Figure 3:
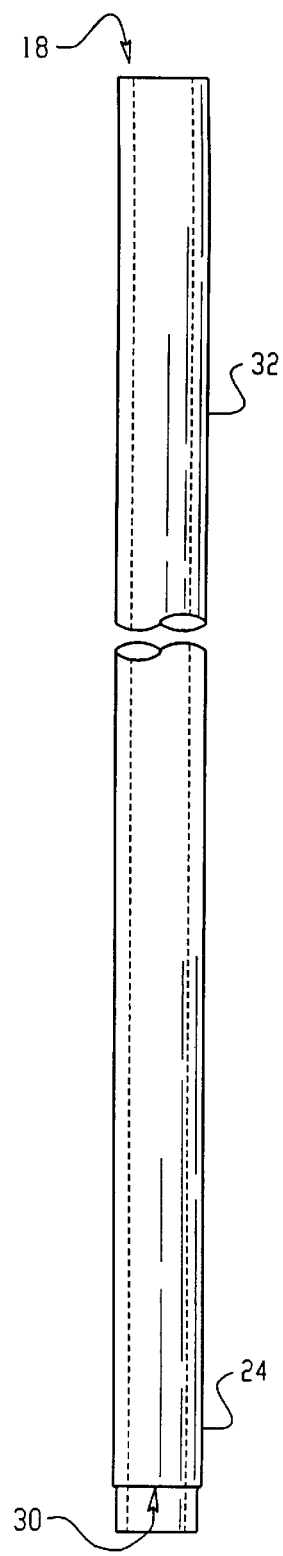
FIG. 3 is a broken sectional view of the injector of the thermal process chamber of FIG. 1.
Figure 4:
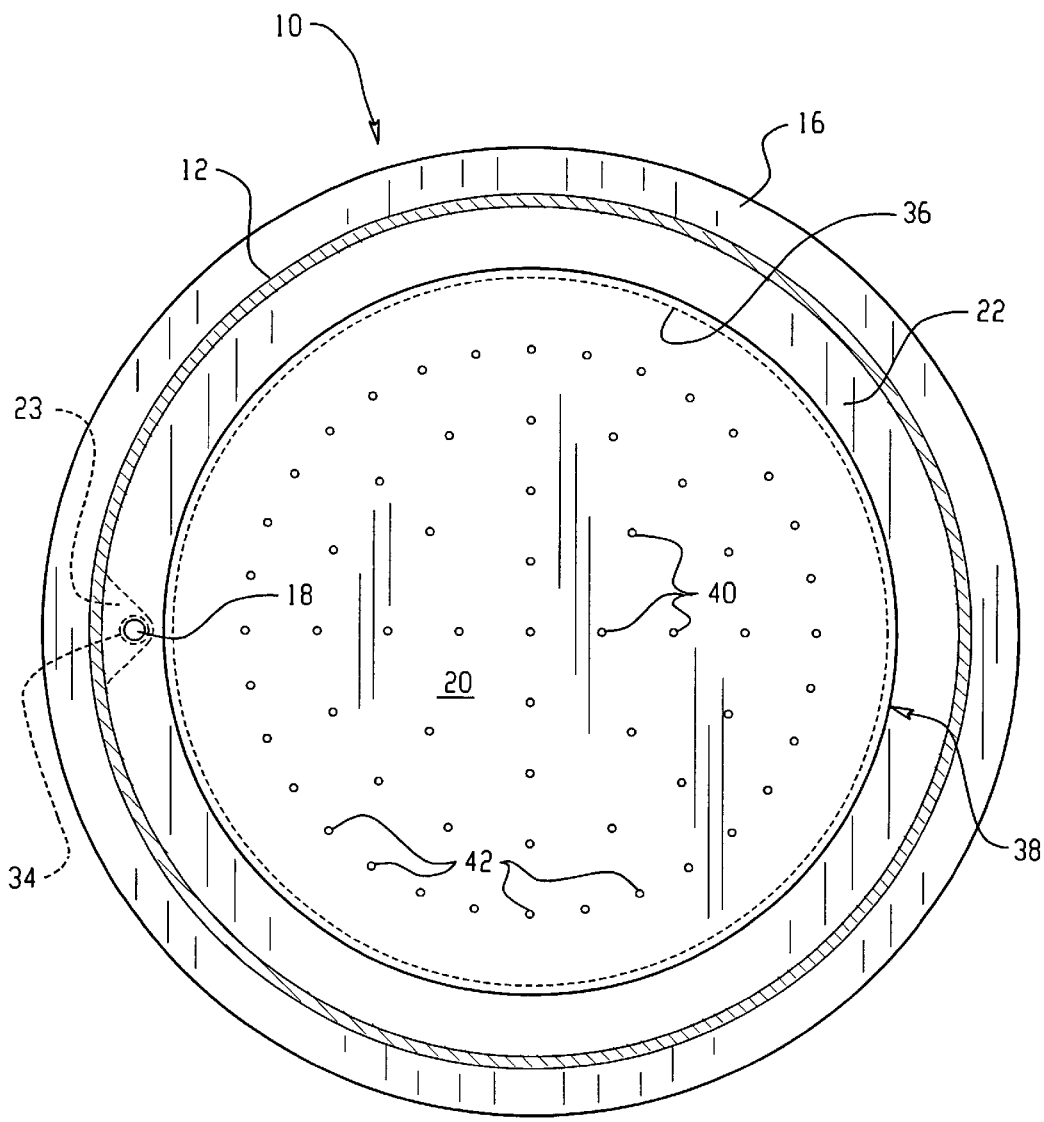
FIG. 4 is a sectional view of the thermal process chamber of FIG. 1, taken along the lines 4—4, showing the integral gas distribution plate of the processing chamber.

FIGS. 2 through 4 show, respectively, more detailed views of the remaining components of the process chamber 10, namely, the lower flange 16, the injector tube 18, and the gas distribution plate 20. As shown in FIG. 2, the lower flange is constructed of an annular mass of silicon carbide. The thickness of the lower flange is on the order of 15 mm.

The lower flange 16 is provided with an inwardly projecting protrusion 23, which provides means for mounting the lower end 24 of the injector tube 18 (see FIG. 3) to the lower flange. The mounting means comprises a hole 26 in the protrusion 23, through which the lower end 24 of the injector tube 18 is inserted prior to curing. The hole 26 is provided with a ledge 28 which mates with a flange 30 to secure the position of the lower end 24 of the injector tube 18 in the flange protrusion 23.

The upper end 32 of the injector tube 18 fits within a hole 34 (refer back to FIG. 1) in the inwardly protruding ridge 22 of the bell jar 11. When the lower end 24 of the injector tube 18 is seated in the hole 26 in lower flange 16, and the upper end 32 of the injector tube is fitted within the hole 34 in ridge 22, the lower end of the cylindrical main portion 12 of the bell jar 11 (opposite the domed crown 14) is seated against the lower flange 16. A substrate such as a wafer to be processed in the bell jar may be inserted into the process chamber 12 via an open end 21 of the bell jar.

As shown in FIG. 1 and 4, the gas distribution plate 20 is positioned within the bell jar 11 by means of the inwardly protruding ridge 22. The inwardly-most protruding edge 36 of the ridge 22 extends inwardly beyond the outer perimeter 38 of the plate 20 to provide support for the plate.

The entire process chamber assembly 10 is then hot-fired in an oven to fuse the components together. Vaporized silicon carbide is then applied to junctions formed by the joined components in a chemical vapor deposition (CVD) process. The deposition of such "filler material" insures that the process chamber 10 provides an air-tight, sealed environment for substrate processing.

Ion operation, a gas such as nitrogen or oxygen is passed through the injector 18 into the interior 39 of the domed crown 14 of the bell jar 11. The gas flows from the domed crown downward, through passageways (channels or holes) 40, 42 in the gas distribution plate 20, and into the interior 44 of the main cylindrical portion 12 of the bell jar. Holes 40 near the center of the gas distribution plate 20 are spaced further apart from each other than those holes 42 about the periphery of the gas distribution plate. The closer spacing between the peripheral holes 42 is designed to alleviate pressure buildup that would tend to accumulate around the periphery of the interior of the domed crown 14.

The sum total of the cross sectional area of the holes 40, 42 is approximately four times the cross sectional area of the injector tube 18 to eliminate any pressure buildup in the domed crown 14 of the bell jar 11. The pattern of holes 40, 42 disclosed provides an even flow of gas through the gas distribution plate. Accordingly, a substrate such as a silicon wafer (not shown) to be processed, positioned within the bell jar below and parallel to the gas distribution plate, will experience an even gas flow across the surface thereof.

The gas is used primarily for oxide formation (e.g., monitor oxides, gate oxides and mask oxides). The silicon carbide construction can safely handle temperatures up to about 1250 degrees Centigrade (°C.). In addition, silicon carbide is inert to processes occurring within the process chamber, unlike more active materials such as aluminum.

Accordingly, a preferred embodiment of a thermal process chamber having an integral gas distribution mechanism has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A thermal process chamber (10) for processing substrates contained therein, comprising:

a main processing portion (12) in which a substrate to be processed may be positioned, said processing portion defining a first area (44) and providing an opening (21) through which a substrate to be processed may be inserted into and removed from said first area (44) of the process chamber;

an upper portion (14), positioned above the main processing portion, defining a second area (39) and providing a closed end for the process chamber;

a gas injector (18) for providing gas to said second area (39), said gas injector (18) disposed within said first area (44) of said processing portion (12); and a gas distribution plate (20) separating said first area (44) from said second area (39), said gas injector (18) extending into said gas distribution plate (20), said gas distribution plate providing a plurality of passageways (40, 42) for permitting gas provided to said second area to pass into said first area, said gas injector (18), said gas distribution plate (20), said main processing portion (12) and said upper portion (14) all being constructed from the same material and fused together to form an integral assembly.

2. The thermal process chamber (10) of claim 1, wherein said main processing portion (12), said upper portion (14), said gas injector (18), and said gas distribution plate (20) are comprised of silicon carbide (SiC).

3. The thermal process chamber (10) of claim wherein said gas injector (18) comprises a tube extending from said opening (21) of said processing portion into said second area (39) of the process chamber, said tube extending substantially along the entire length of said processing portion (12) adjacent to but spaced apart from a wall thereof.

4. The thermal process chamber (10) of claim 3, further comprising a lower flange (16) defining said opening (21), said lower flange provided with a hole (26) into which a lower end (24) of said tube (18) is seated.

5. The thermal process chamber (10) of claim 4, wherein said lower flange (16) is comprised of silicon carbide (SiC).

6. The thermal process chamber (10) of claim 4, further comprising an inwardly protruding ridge (22) extending about the inner periphery of the thermal process chamber, said ridge (22) providing an edge (36) against which said gas distribution plate (20) abuts for positioning said plate within the thermal process chamber.

7. The thermal process chamber (10) of claim 6, wherein said ridge (22) is provided with a hole (34) at least partially through which an upper end (32) of said gas injector (18) passes.

8. The thermal process chamber (10) of claim 2, wherein said passageways (40, 42) in said gas distribution plate (20) comprise first passageways (40) and second passageways (42), said second passageways (42) positioned closer in proximity to each other than said first passageways (40).

9. The thermal process chamber (10) of claim 8, wherein said second passageways (42) are positioned about the periphery (38) of said gas distribution plate (20).

10. The thermal process chamber (10) of claim 2, further comprising vaporized silicon carbide (SiC) material applied via a chemical vapor deposition (CVD) process to junctions formed by said main processing portion (12), said upper portion (14), said gas injector (18), and said gas distribution plate (20), to provide an air-tight, sealed, integral assembly.

* * * * *